United States Patent [19]
Kaneshiro et al.

[11] Patent Number: 5,513,021
[45] Date of Patent: Apr. 30, 1996

[54] OPTICAL DETECTORS AND SOURCES WITH MERGED HOLOGRAPHIC OPTICAL ELEMENTS SUITABLE FOR OPTOELECTRONIC INTERCONNECTS

[75] Inventors: Ronald Kaneshiro; Joseph Straznicky, both of Mountain View, Calif.

[73] Assignee: Hewlett-Packard Company, Palo Alto, Calif.

[21] Appl. No.: 496,997

[22] Filed: Jun. 30, 1995

Related U.S. Application Data

[63] Continuation of Ser. No. 150,648, Nov. 9, 1993, abandoned.

[51] Int. Cl.$^6$ ............................... G02B 5/32; G02B 6/12
[52] U.S. Cl. .............................................. 359/15; 385/14
[58] Field of Search .................... 359/15, 154, 157, 359/159, 164, 173, 180, 189; 385/19

[56] References Cited

U.S. PATENT DOCUMENTS

| | | | |
|---|---|---|---|
| 4,711,997 | 12/1987 | Miller . | |
| 4,946,253 | 8/1990 | Kostuck | 350/169 |
| 5,061,027 | 10/1991 | Richard | 385/14 |
| 5,071,232 | 12/1991 | Kato et al. | 359/15 |
| 5,073,041 | 12/1991 | Rastani | 385/33 |
| 5,101,460 | 3/1992 | Richard | 385/37 |
| 5,159,473 | 10/1992 | Feldman | 359/1 |
| 5,159,700 | 10/1992 | Reid et al. | 385/14 |
| 5,237,434 | 8/1993 | Feldman et al. | 359/15 |

OTHER PUBLICATIONS

James W. Parker, "Optical Interconnection for Advanced Processor Systems: A Review of the ESPRIT II OLIVES", Journal of Lightwave Technology, vol. 9, No. 12, Dec., 1991, pp.1764–1773.

M. J. Goodwin, et al., "Optoelectronic Component Arrays for Optical Interconnection of Circuits and Subsystems", Journal of Lightwave Technology, vol. 9, No. 12, Dec., 1991, pp. 1639–1645.

A. J. Moseley, et al., "8×8 Flipchip Assembled in GaAs Detector Arrays for Optical Interconnect", Electronic Letters, 15th Aug., 1991, vol. 27, No. 17, pp. 1566–1567.

Michael R. Feldman, et al., "Computer General Holographic Optical Elements for Optical Interconnection of Very Large Scale Integrated Circuits", Applied Optics, vol. 26, No. 20, 15 Oct., 1987, pp. 4377–4384.

Michael Feldman, "Holographic Optical Interconnects for Multichip Modules", Electronic Engineering, Sep., 1992, pp. 49–53.

Michael Wale, et al., "Flip-Chip Bonding Optimizes Opto–ICs", IEEE Circuits and Devices, Nov., 1992, pp. 25–31.

S. M. Sze, "Physics of Semiconductor Devices", Chapters 12 and 13, pp. 681–789, John Wiley & Sons, New York.

*Primary Examiner*—Frank Gonzalez
*Assistant Examiner*—Jason D. Eisenberg

[57] ABSTRACT

A novel apparatus for optically interconnecting integrated circuits that reduces optical path alignment difficulties and enhances signal quality. The present invention employs one or more holographic optical elements adapted for directing one or more modulated beams of light. Because each holographic optical element is individually aligned with a respective photonic device, the present invention is free from registration run off that is associated with large dimension optical substrates employed in previous optical interconnect schemes. Accordingly, optical path alignment between transmitting photonic devices and receiving photonic devices is preserved.

18 Claims, 7 Drawing Sheets

OPTICAL DETECTORS AND SOURCES WITH MERGED HOLOGRAPHIC OPTICAL ELEMENTS SUITABLE FOR OPTOELECTRONIC INTERCONNECTS

This is a continuation of application Ser. No. 08/150,648 filed on Nov. 9, 1993, now abandoned.

BACKGROUND OF THE INVENTION

The present invention relates generally to signal interconnections between integrated circuit (I.C.) chips, and more particularly to optical interconnections of integrated circuits in multichip modules.

Modules that incorporates multiple computing chips are needed to realize advanced computers such as highly parallel computational systems that employ next generation Very Large Scale Integration (VLSI) computing chips. Such systems require highly dense connection networks that contain many increased length or "long distance" high speed intramodule connections. For successful system design it is important to reduce the area, power requirements, and time delay of these intramodule connections.

For example, next generation processor arrays typically include hundreds of chips. Given each chip containing 512 processing elements per chip, and each processing element requiring at least one increased length connection, a multichip module system capable of providing approximately 512 connections per chip is needed. Accordingly, a module containing 64 chips requires over 32,000 increased length intramodule connections. Such a large number of increased length intramodule connections can easily impede system performance unless the area, power requirements, and time delay of these intramodule connections is reduced.

In highly parallel systems that employ only conventional electrical connection technology, increased length intramodule electrical connections are responsible for a large share of a total power dissipation, time delay and surface area consumption of each system. To avoid such difficulties, intramodule connections longer that a specified length are characterized as increased length or "long distance" connections and are implemented using optical technology. By replacing increased length electrical intramodule connections with optical connections, a communications "bottle neck" is relieved. Such optical interconnects increase communication speed and reduce the volume, cross talk and power dissipation of increased length connections.

Figure 1:
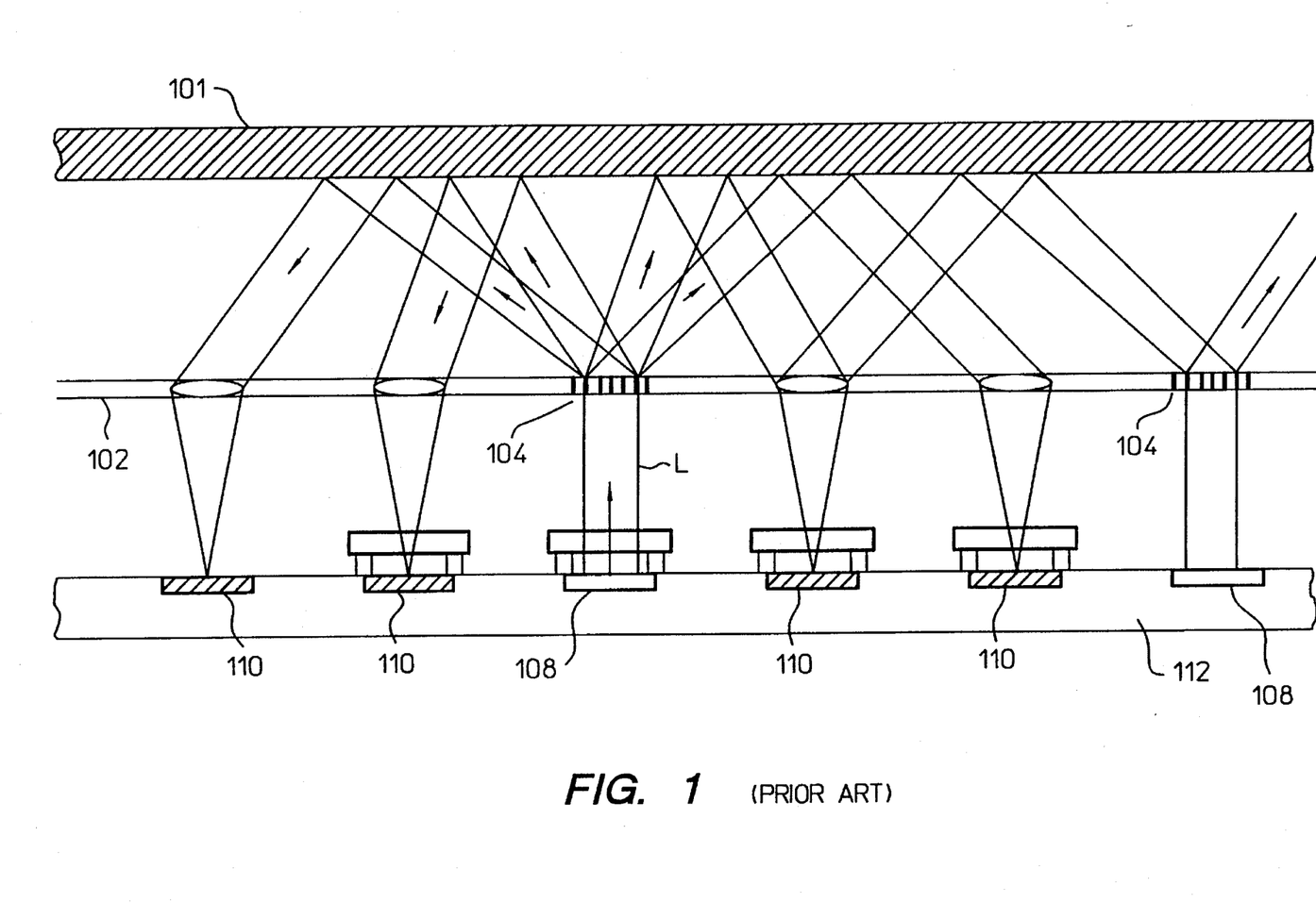
FIG. 1 is a cut away side view showing a previously known optical interconnection scheme.

FIG. 1 is a cut away side view showing a previously known optical interconnection scheme. As shown the scheme includes a mirror 101 and a single contiguous large dimension holographic optical substrate 102 incorporating transmitter holograms 104 and receiver holograms 106. The scheme further includes Gallium Arsenide (GaAs) optical transmitter chips 108, and silicon Integrated Circuit (IC) chips 110. As shown in FIG. 1, both GaAs and silicon chips are mounted on a supporting substrate of a multichip module 112.

Each of the GaAs transmitter chips contains arrays of surface emitting lasers. A center to center spacing between adjacent lasers is approximately 300 microns in order to limit the power dissipation per unit area and to provide sufficient area to place a contact pad adjacent to each laser. This allows for a density of 1,000 lasers per one square centimeter on each GaAs chip. The silicon integrated circuit chips contain integrated optical detectors.

As shown in FIG. 1, thin film interconnects are formed on a surface of the substrate in areas between the chips. Transparent translator chips are mounted on top of the substrate in such a way that each translator chip is placed over a respective one of the silicon or GaAs chips. The translator chips contain no active devices, only conductive metal paths coupled to contact pads. The translator chips are used to route connections from the chips onto the thin film interconnects on the substrate surface. The scheme illustrated by FIG. 1 is similar to one discussed in an article "Holographic Optical Interconnects for Multichip Modules" by M. Feldman, Electronic Engineering Sept. 1992, pg. 49–53. Because the article provides helpful background information, it is hereby incorporated by reference.

The lasers of the transmitters are optically coupled to the optical detectors by employing the mirror 101 and the single contiguous large dimension optical substrate 102 having a plurality of holograms incorporated therein to form a double pass holographic arrangement. For example, as illustrated FIG. 1, light, L, from one of the lasers illuminates one of the transmitter holograms 104 of the large dimension holographic optical substrate 102. The transmitter hologram divides the laser light into a plurality of beams, so that each passes through a respective one of the receiver holograms after reflection off of the mirror 101. Each receiver hologram acts as a single lens and focuses the light beam onto a respective one of the optical detectors. Accordingly, in the previously known scheme illustrated in FIG. 1, the mirror and the large dimension holographic optical substrate are employed so that the beams follow optical paths between the lasers and detectors.

Though such previously known optical interconnection schemes provide some advantages, some problems still remain. In accordance with previously known schemes, constructing the optical interconnection apparatus shown in FIG. 1 involves a critical alignment step to align the single contiguous large dimension holographic optical substrate 102 with the supporting substrate 112 of the multichip module. Such alignment is achieved using a through-wafer I.C. mask aligner. Alignment problems such as registration run off are associated with I.C. mask aligners employed to align any holographic optical substrates having large dimensions, for example lateral dimensions of 10 centimeters by 10 centimeters. In general, as size of such substrates is increased, registration run off becomes worse. Resulting misalignment of the optical paths between the lasers and detectors impairs performance of the optical interconnections. Furthermore, even the largest conventional I.C. mask aligners are severely limited in their capability to handle substrates that are above a particular size. Since critical alignment of the large dimension holographic optical substrate with the supporting substrate is achieved using the through-wafer IC mask aligner, the capability of the I.C. mask aligner limits the size of substrates that can be aligned, and therefore limits the size and sophistication of multichip modules that can be assembled by optically interconnecting constituent I.C.'s.

What is needed is an optoelectronic apparatus for optically interconnecting integrated circuits that reduces optical path alignment difficulties and enhances signal quality. In particular, what is needed is an optical interconnection apparatus that is free from the registration run off associated with the large dimension holographic optical substrates of previously known optical interconnect schemes. Furthermore, the apparatus should surpass previously known limitations on the size and sophistication of multichip modules that can be assembled by optically interconnecting constituent I.C.'s.

SUMMARY

The present invention provides a novel apparatus for optically interconnecting integrated circuits that reduces optical path alignment difficulties and enhances signal quality. As will be discussed in greater detail later herein, the present invention employs one or more holographic optical elements adapted for directing one or more modulated beams of light. Because each holographic optical element is individually aligned with a respective photonic device, the present invention is free from registration run off that is associated with a single contiguous large dimension holographic optical substrate employed in a previously known optical interconnect scheme. Accordingly, optical path alignment between transmitting photonic devices and receiving photonic devices is preserved.

Furthermore, the present invention surpasses limitations imposed by the previously known optical interconnection scheme that employs the single contiguous large optical substrate. Such previously known schemes limit the size and sophistication of multichip modules because such schemes use a through-wafer I.C. mask aligner to align the large dimension optical substrate. Even the largest conventional I.C. mask aligners are severely limited in their capability to handle substrates that are above a particular size. In contrast to such previously known schemes, the present invention utilizes a respective holographic optical element individually aligned with each photonic device. In accordance with the principles of the present invention, larger and more sophisticated multichip modules are assembled, exceeding the limitations imposed by previously known schemes.

Briefly and in general terms, the present invention provides efficient interconnection between a first integrated circuit and a second integrated circuit by means of an optoelectronic transmitter optically coupled to at least one optoelectronic receiver. The receiver is optically coupled to the transmitter so as to receive a modulated beam of light emitted by the transmitter. The modulated beam of light follows an optical path between the transmitter and the receiver. In a similar manner as described herein, the present invention provides additional transmitters and receivers as needed to interconnect remaining integrated circuits of the multichip module.

The present invention includes photonic devices that are employed in the optoelectronic transmitters and receivers to provide optical communication between integrated circuits. For example, the transmitter includes a first photonic device for generating the beam of light, which is modulated by the transmitter in response to an electrical drive signal received by the transmitter from the first integrated circuit. Similarly, the receiver includes a second photonic device for generating an electrical signal in response to the modulated beam of light. The second integrated circuit is coupled to the receiver so as to receive the responsive electrical signal.

Holographic optical elements of the present invention are adapted to steer the modulated beam of light, directing the modulated beam of light along the optical path between the transmitter and the receiver. In accordance with the principles of the invention, a hologram is individually aligned with the second photonic device to redirect the beam of light into the second photonic device. Another hologram is individually aligned with the first photonic device to direct the path of the beam of light emitted by the transmitter. Preferably, each hologram is made integral with the respective photonic device by etching each hologram into a respective surface of the respective photonic device. Alternatively, each hologram is included in a respective holographic plate that is individually mounted on a respective photonic device to preserve optical alignment between the plate and the device.

Other aspects and advantages of the present invention will become apparent from the following detailed description, taken in conjunction with the accompanying drawings, illustrating by way of example the principles of the present invention.

DETAILED DESCRIPTION OF THE PREFERRED EMBODIMENT

As shown in the drawings for purposes of illustration, the invention is embodied in an optoelectronic apparatus for interconnecting integrated circuits that reduces optical alignment difficulties and enhances signal quality. The present invention provides efficient interconnection between integrated circuits by means of an optoelectronic transmitter coupled to at least one optoelectronic receiver. In a similar manner as described herein, the present invention provides additional transmitters and receivers as needed to interconnect remaining integrated circuits of a multichip module. The receiver is optically coupled to the transmitter so as to receive a modulated beam of light emitted by the transmitter. Holographic optical elements of the present invention are adapted to steer the modulated beam of light, directing the modulated beam of light along an optical path between the transmitter and the receiver. For example, a hologram individually aligned with the receiver redirects the beam of light into the receiver. Another hologram individually aligned with the transmitter directs the path of the modulated beam of light emitted by the transmitter. Since each hologram is individually aligned, the present invention is free from registration run off that is associated with previously known techniques employing large dimension optical substrates.

Figure 2:
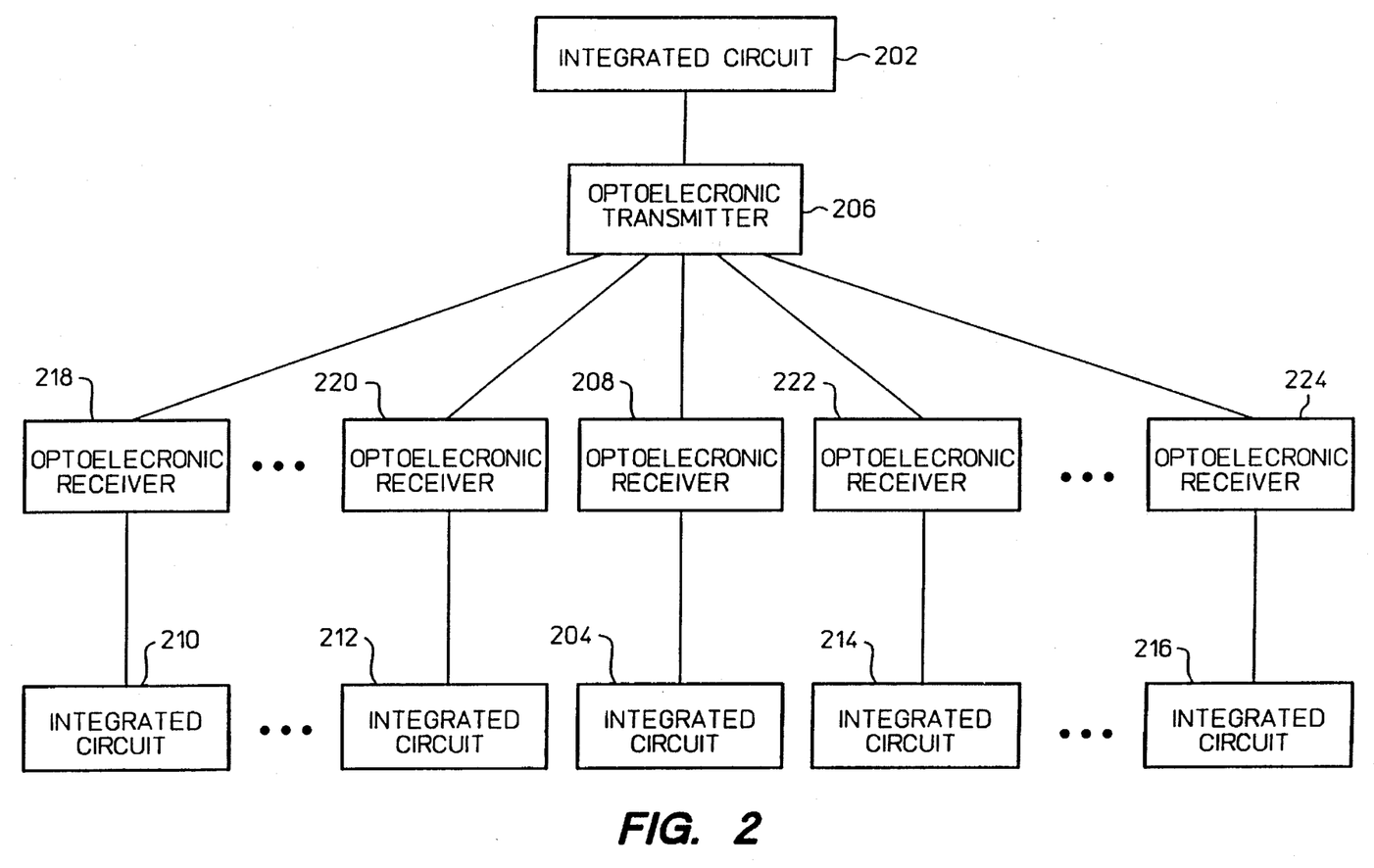
FIG. 2 is a block diagram illustrating the optoelectronic apparatus of the present invention.

As illustrated in the block diagram of FIG. 2, the present invention provides interconnection between a first integrated circuit 202 and a second integrated circuit 204 by means of an optoelectronic transmitter 206 optically coupled to an optoelectronic receiver 208. The optoelectronic transmitter is electrically coupled to an output port of the first integrated circuit for receiving a first electrical signal, which modulates a beam of light emitted by the transmitter. For the sake of clarity, additional electrical connections between additional integrated circuits and the optoelectronic transmitter are not shown in FIG. 2.

The receiver 208 is optically coupled to the transmitter for receiving the modulated beam of light and for producing a second electrical signal in response to the modulated beam. An input port of the second integrated circuit 204 is electrically coupled to the receiver for receiving the second electrical signal. Similarly, the first integrated circuit 202 is interconnected with the additional integrated circuits 210, 212, 214, 216 shown in FIG. 2 by means of the optoelectronic transmitter 206 optically coupled to additional optoelectronic receivers 218, 220, 222, 224. For example, a second receiver 224 is optically coupled to the transmitter for receiving the modulated beam of light and for producing an additional electrical signal in response to the optical signal. An input port of a third integrated circuit 216 is electrically coupled to the receiver for receiving said additional electrical signal. In a similar manner as discussed, the optoelectronic transmitter is optically coupled to every integrated circuit wherein such interconnection is needed.

In multichip modules comprising a plurality of integrated circuit chips, intramodule connections longer that a specified length, for example 2 centimeters, are characterized as increased length or "long distance" connections. By implementing such increased length intramodule connections with optical connections, a communications "bottle neck" can be relieved. Such optical interconnects increase communication speed, and reduce the cross talk, and power dissipation, and physical volume of increased length connections.

Figure 3:
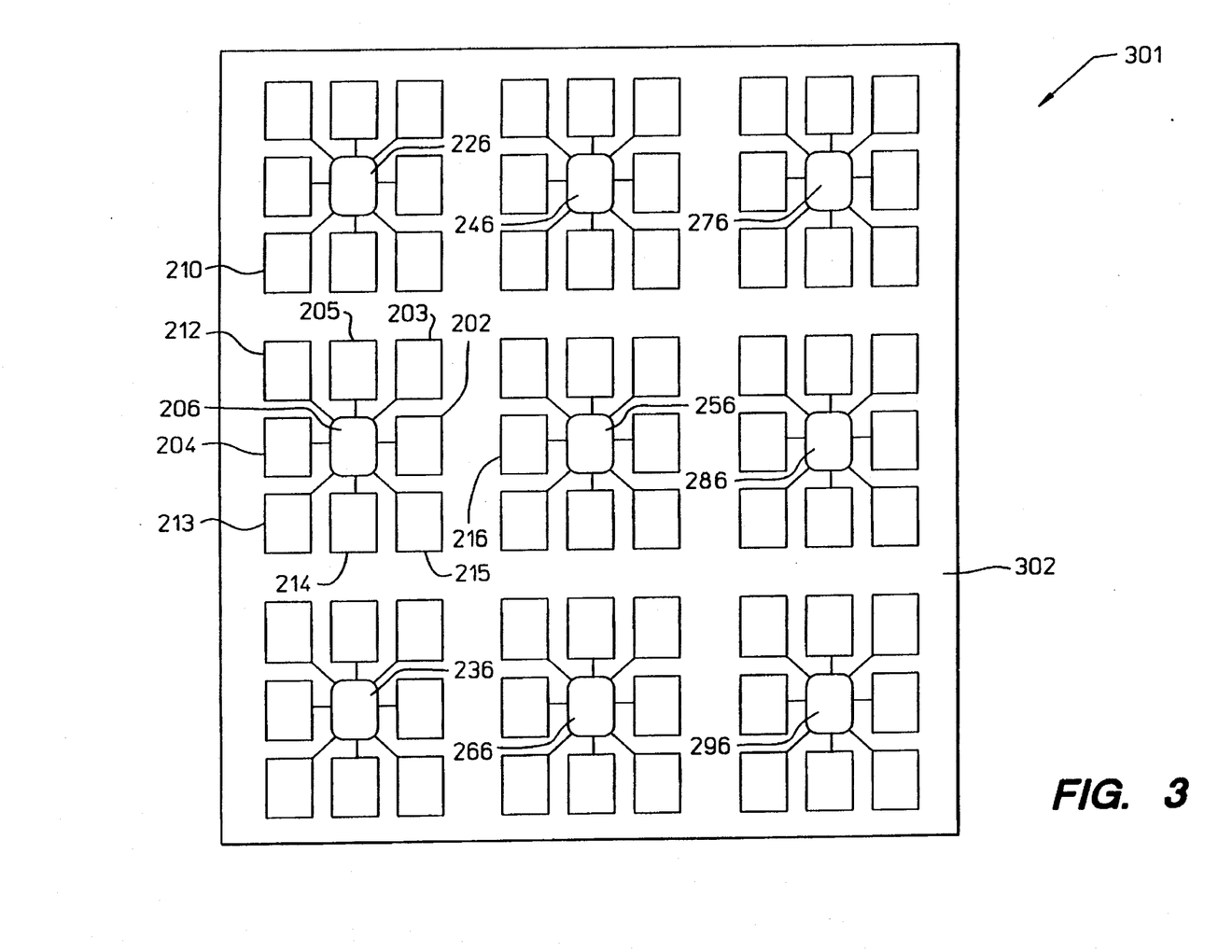
FIG. 3 is a plan view of a preferred embodiment of the optoelectronic apparatus.

FIG. 3, is a plan view of a preferred embodiment of the optical interconnect apparatus including a plurality of optoelectronic transmitters 206, 226, 236, 246, 256, 266, 276, 286, 296 employed in a multichip module 301. As shown in FIG. 3 each optoelectronic transmitter is positioned adjacent to a respective grouping of integrated circuit chips. For example, FIG. 3 shows the optoelectronic transmitter 206 positioned adjacent to a first grouping of integrated circuits comprising eight integrated circuits 202, 203, 204, 205, 212, 213, 214, 215. Each of the optoelectronic transmitters is electrically coupled to members of the respective grouping of integrated circuits by respective electrical conductor means, symbolically illustrated in FIG. 3 by line segments extending between the integrated circuits and the optoelectronic transmitter. For example, the optoelectronic transmitter 206 is electrically coupled to each of the eight integrated circuits 202, 203, 204, 205, 212, 213, 214, 215 by electrical conductor means.

The transmitters and integrated circuit chips are disposed on an outer surface of a multichip module substrate 302 for supporting the transmitters and integrated circuit chips. As will be discussed in greater detail later herein, apertures in the multichip module substrate are provided for allowing optical communication between the transmitters and receivers mounted on the integrated circuit chips.

In the preferred embodiment, each optoelectronic transmitter receives a respective electric signal from each member of the respective grouping of integrated circuits. For example, in a similar manner as discussed previously with respect to the block diagram of FIG. 2, the optoelectronic transmitter 206 shown in FIG. 3 is electrically coupled to the first integrated circuit 202 for receiving the first electrical signal. As discussed previously, the first electrical signal modulates the beam of light emitted by the transmitter 206.

In the preferred embodiment, at least a respective one of the optoelectronic receivers (not shown in FIG. 3) are mechanically coupled to each integrated circuit of the multichip module. Alternatively, respective optoelectronic receivers may be etched into each integrated circuit. Each integrated circuit of the multichip module that requires increased length or "long distance" connections with various other integrated circuits is optically coupled to one or more optoelectronic transmitters. For example, as discussed previously with respect to FIG. 2, the receiver associated with the second integrated circuit 204 shown in FIG. 3 is optically coupled to the transmitter 206 for receiving the modulated beam of light emitted therefrom and for producing a second electrical signal in response to the optical signal. As discussed previously with respect to FIG. 2, the second integrated circuit 204 is electrically coupled to the receiver for receiving the second electrical signal.

Similarly, the first integrated circuit 202 is optically interconnected with additional integrated circuits 210, 212, 214, 216 shown in FIG. 3 by means of the optoelectronic transmitter 206. As another example, the third integrated circuit 216, shown in FIG. 3, is electrically coupled to the second receiver mounted thereon (not shown in FIG. 3). The second receiver of the third integrated circuit 216 is optically coupled to the transmitter for receiving the modulated beam of light and for producing the additional electrical signal in response to the modulated beam.

Photonic devices are employed in optoelectronic transmitters and receivers of the present invention to provide optical communication therebetween. Such photonic devices include devices that convert electrical energy into optical radiation such as diode lasers, light emitting diodes (LED's), and the like, and further include devices such as photodetectors that detect light through electronic processes. Photonic devices are discussed in chapters 12 and 13 of "Physics of Semiconductor Devices" by S. Sze, John Wiley & Sons (1981), pg. 681–789. Because these chapters provide helpful supportive teachings, they are incorporated herein by reference.

In the preferred embodiment, the optoelectronic transmitters employ planar arrays of Gallium Arsenide diode lasers, each array having an emitting surface for emitting optical signals therefrom. It is also preferred that the optoelectronic receivers employ silicon photodetectors, each having a receiving surface for receiving a respective modulated beam of light. It should be understood that alternative photonic devices may also be employed in the optoelectronic transmitters and receivers discussed herein with beneficial results. For example, Indium Gallium Arsenide photodetectors may be used in place of silicon photodetectors.

Figure 4:
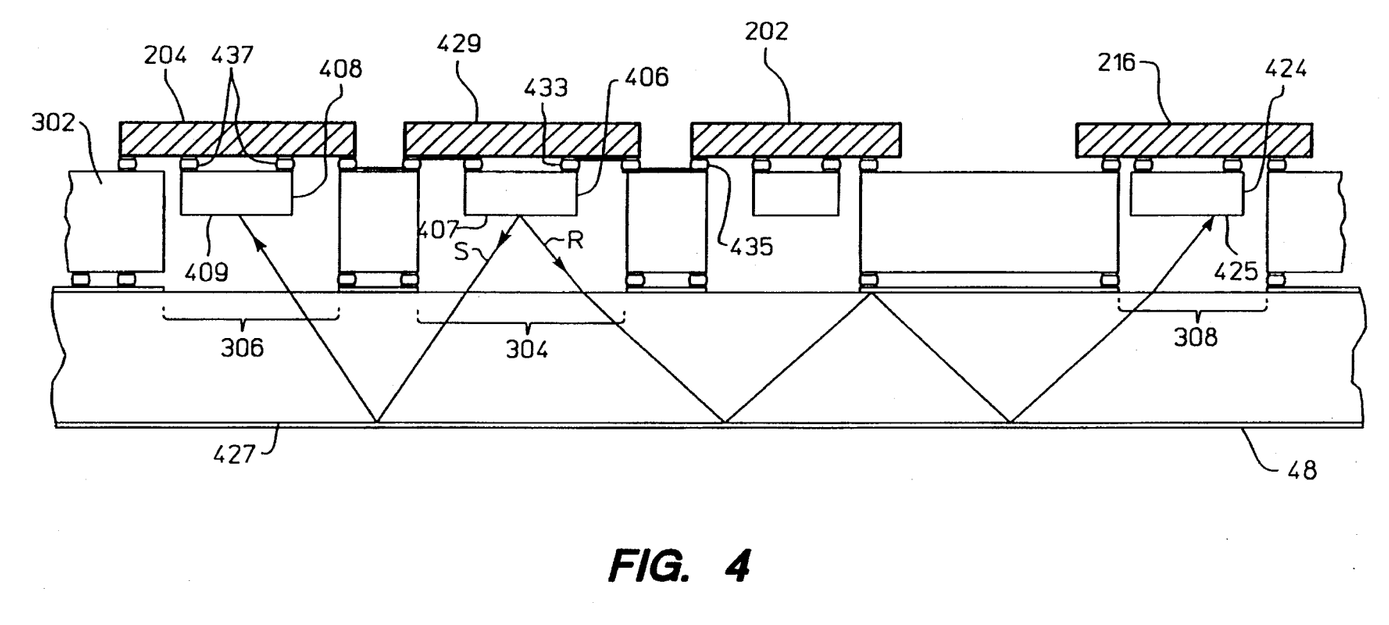
FIG. 4 is a cut away side view of the preferred embodiment of the optoelectronic apparatus.

FIG. 4 is a cut away side view of the preferred embodiment of the optoelectronic apparatus of the present invention. FIG. 4 shows a first photonic device 406 employed in the optoelectronic transmitter. The first photonic device is optically coupled to a second photonic device 408, which is employed in the optoelectronic receiver. Holographic optical elements of the present invention are adapted to steer the modulated beam of light, directing the modulated beam of light along an optical path between the transmitter and the receiver. Specifically, a hologram individually aligned with the second photonic device 408 employed in the receiver redirects the modulated beam of light into the second photonic device. Another hologram, individually aligned with the first photonic device 406 employed in the transmitter, directs the path of the modulated beam of light emitted by the first photonic device.

In the preferred embodiment shown in FIG. 4, each hologram is integral with the respective photonic device, preferably by etching each hologram into a respective surface of the respective photonic device, Accordingly, in the preferred embodiment, the hologram individually aligned with the second photonic device 408 is integral with a receiving surface 409 of the second photonic device. Similarly, the hologram individually aligned with the first photonic device 406 is integral with an emitting surface 407 of the first photonic device. The hologram integral with the first photonic device 406 directs each of the optical paths followed by the modulated beam of light as it passes from the emitting surface 407 of the first photonic device. Features of the hologram integral first photonic device are etched into the emitting surface and arranged for directing the path of the beam of light at an oblique angle with respect to the emitting surface, as shown in FIG. 4. The receiving surface 409 of the second photonic device is oriented for receiving the modulated light beam at an oblique incidence to the receiving surface. The hologram integral with the receiving surface includes features etched into the receiving surface and arranged to redirect the path of the obliquely incident light beam into the second photonic device. Because each hologram of the preferred embodiment is integral with the respective photonic device, each hologram is individually aligned with the respective device and is free from registration run off that is associated with previously known interconnection techniques employing large dimension optical substrates.

As shown in FIG. 4, the multichip module substrate 302 has apertures 304, 306, 308 extending therethrough for allowing optical communication between the optoelectronic transmitter and optoelectronic receivers. For example, the hologram integral with the emitting surface 407 directs each of the paths of the modulated beam of light as discussed previously. Specifically, FIG. 4 illustrates the hologram integral with the emitting surface directing a first optical signal path, S, and a second optical signal path, R, through a first aperture 304 in the multichip module substrate. In the preferred embodiment, light following each optical path encounters a reflective means for reflecting light of each optical signal path to a receiving surface of a respective one of the photonic devices. For example, as shown in FIG. 4, the modulated beam of light follows the first optical path, S, though a second aperture 306 in the multichip module substrate to be received by the receiving surface 409 of the second photonic device 408, which is coupled to the second integrated circuit 204. Similarly, the modulated light beam follows the second signal path, R, through a third aperture 308 in the multichip module substrate to be received by a receiving surface 425 of a third photonic device 424, which is coupled to the third integrated circuit 216.

In the preferred embodiment, the reflecting means of the preferred embodiment includes one or more reflective metal layers 427 deposited on a transparent dielectric substrate 428. The reflective metal layer is optically coupled to the emitting surface of the first photonic device so that light following each of the optical signal paths is reflected as shown in FIG. 4. Such factors such as a refractive index of the dielectric layer, thickness of the dielectric layer, positioning of the dielectric layer relative to the photonic devices, and relative positioning of optically interconnected photonic devices are all considered in etching the holograms employed in the present invention so that the optical signal paths impinge upon the dielectric layer at correct angles to support the optical communication between the transmitter and the receiver. Instead of employing the dielectric layer exemplified in FIG. 4, other optical signal guiding techniques such as optical waveguide techniques may be alternatively employed with beneficial results.

In the preferred embodiment shown in FIG. 4, an electrical interconnect substrate 429 and the integrated circuit chips 202, 204, 216 are mounted on the multichip module substrate 302 using conductive flip-chip solder bonds. The first photonic device 407 is mechanically coupled to the electrical interconnect substrate 429 using additional flip-chip solder bonds. The second photonic device 409 is mechanically coupled to the second integrated circuit 204 using yet additional flip-chip solder bonds.

As discussed previously with respect to FIG. 3, each optoelectronic transmitter is electrically coupled to members of the respective grouping of integrated circuits by respective electrical conductors. For example, as shown in FIG. 4, a first conductor electrically coupling the output port of the first integrated circuit to the transmitter conducts the first electrical signal therebetween. In the preferred embodiment, the first conductor comprises a first set of conductive metal pathways, representatively shown in FIG. 4 as darkened lines. The first set of conductive pathways are deposited upon the multichip module substrate and the electrical interconnect substrate 429. Alternative conductive pathways, such as conductive polysilicon pathways may be employed with beneficial results. Photolithographic techniques or other suitable techniques may be employed for depositing the conductive pathways. In a similar manner as discussed previously with respect to the first set of conductive pathways, additional sets of conductive pathways deposited upon the multichip module substrate and the electrical interconnect substrate are employed to electrically couple each member of the first grouping of integrated circuits to the optoelectronic transmitter. Similarly, yet more sets of conductive metal pathways deposited upon the multichip module substrate and on additional electrical interconnect substrates are employed to electrically couple each optoelectronic transmitter of the multichip module to the respective grouping of integrated circuits.

Each conductor electrically coupled to the respective one of the transmitters further includes one or more of the conductive flip-chip solder bonds, which provide electrical contact between each conductor and the respective transmitter. Because the flip-chip solder bonds provide reduced parasitic reactances, electrical signals arrive at the optoelectronic transmitters with enhanced bandwidth characteristics. For example, as shown in FIG. 4, conductive flip-chip solder bonds 433 provide electrical contact between the first conductor means and the first photonic device 407 employed in the transmitter. Because the flip-chip solder bonds provide reduced parasitic inductance and capacitance of the electrical contact, the first electrical signal has an enhanced bandwidth.

In the preferred embodiment, the integrated circuits include output ports comprising solder wetable metalized pads. The solder wetable pads of the integrated circuits are integral with conductive flip-chip solder bonds. For example, as shown in FIG. 4, in the preferred embodiment the first conductor means further includes conductive flip chip solder bonds 435 providing electrical contact between the first conductor means and the output port of the first integrated circuit.

Furthermore, each integrated circuit is electrically coupled to at least one of the optoelectronic receivers by respective electrical conductors. For example, FIG. 4 shows a second conductor for electrically coupling the receiver to the input port of the second integrated circuit and for conducting the second electrical signal therebetween. The second conductor includes conductive flip-chip solder bonds 437 extending outwardly from the surface of the second integrated circuit for providing electrical contact between the second conductor means and the receiver. The second integrated circuit includes input ports comprising solder wetable metalized pads, integral with the flip-chip solder bonds 437 extending from the integrated circuits. Because the conductive flip-chip solder bonds provide reduced parasitic reactances, reduced minimum optical signal levels are needed to produce the electrical signals received by the integrated circuits. For example, by providing reduced parasitic inductance and capacitance of the electrical contact between the second electrical conductor the optoelectronic receiver, a reduced minimum optical signal level is needed to produce the second electrical signal received by the second integrated circuit.

Figure 5A:
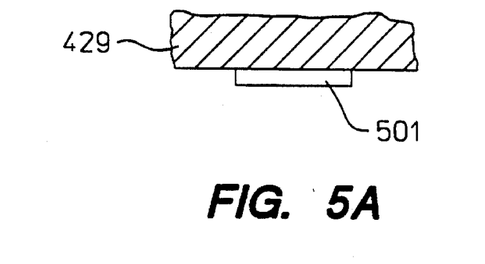
FIGS. 5A through 5G are detailed cut away cross sectional views illustrating making the flip-chip solder bonds employed in the present invention.
Figures 5B, 5D:
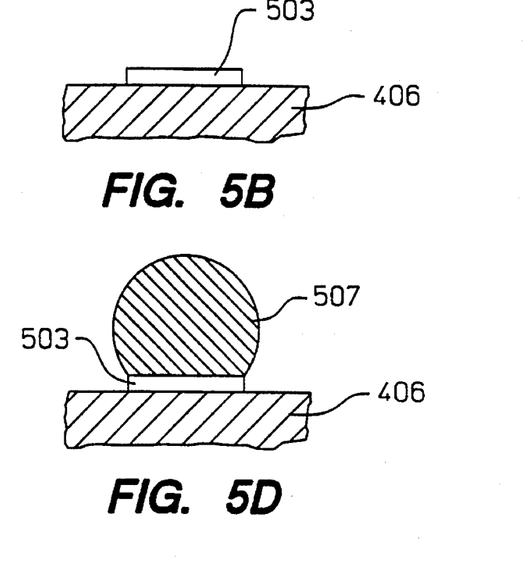
Figure 5C:
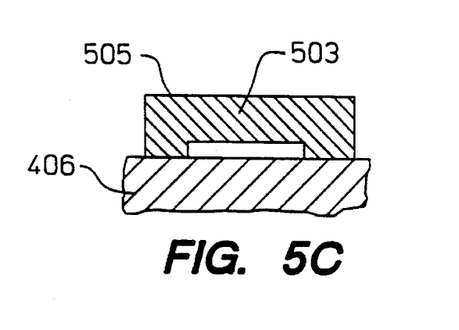
Figure 5E:
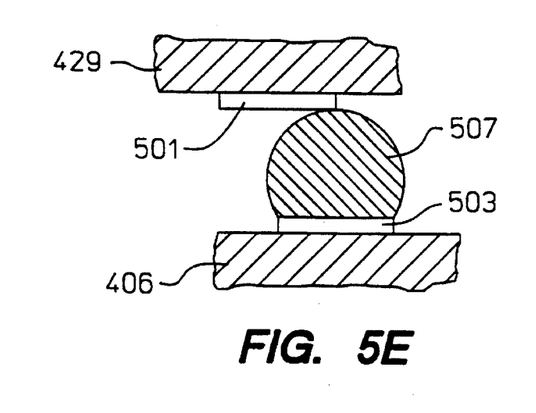
Figure 5F:
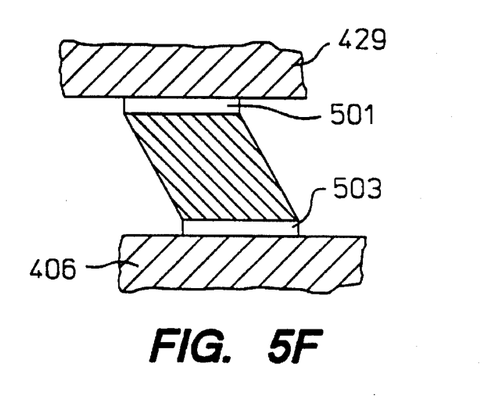
Figure 5G:
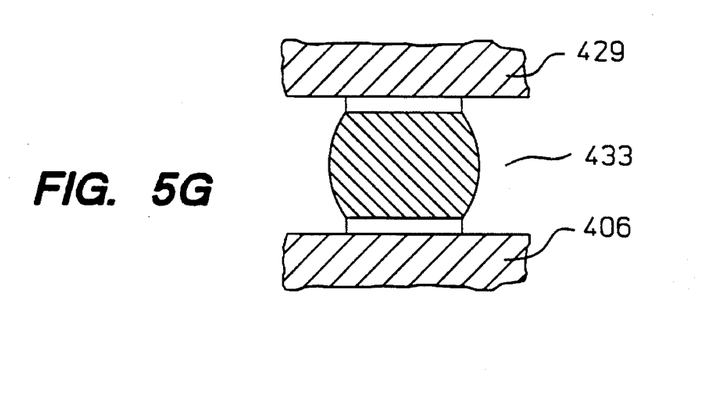

In FIGS. 5A–G, generalized steps for making the flip-chip solder bonds employed in the present invention are specifically illustrated for one of the flip-chip solder bonds 433. The concepts so illustrated are generally applicable to making all the flip-chip solder bonds employed in the present invention. Using photolithographic techniques, a first solder wetable pad 501 is deposited on the electrical interconnect substrate 429, shown in detailed cut away cross sectional view in FIG. 5A. Similarly, as shown in FIG. 5B, a matching solder wetable pad 503 is deposited on the first photonic device 406. As shown in FIG. 5C, a controlled volume of solder 505 is then deposited over the matching solder wetable pad 503 using vacuum deposition. As shown in FIG. 5D, the solder is heated above its melting point to reflow into a molten solder bump 507, which is then allowed to cool. As shown in FIG. 5E, the electrical interconnect substrate 429 is brought into approximate alignment with the first photonic device. Upon heating, the solder becomes molten once again. As shown in FIG. 5F, high surface tension of the molten solder acts to pull the electrical interconnect substrate 429 towards alignment with the first photonic device. As shown in FIG. 5G, after the substrate and device are precisely aligned by the surface tension, the solder is cooled to produce the flip-chip solder bond 433.

For the holographic optical elements employed in the present invention, it is preferred that the holograms be computer generated. Such computer generated holograms provide great flexibility in steering the modulated beams of light and further provide for splitting the modulated beams to follow more than one optical path, as discussed previously herein. For example, computer generated holograms are constructed employing electron beam lithography techniques, wherein a computer controls an electron beam which determines etching of hologram features. Photolithography or other techniques may be alternatively employed with beneficial results. In general, computer generated holograms with a first number, N, different phase levels are produced employing a smaller number, Log N, etching steps, Computer generated holograms are discussed in "Computer generated holographic optical elements for optical interconnection of very large scale integrated circuits" by Feldman et al., Applied Optics Vol. 26, No. 20, Oct. 15, 1987, pgs. 4377–4384. Because this article includes some helpful supportive teachings regarding computer generated holograms, it is incorporated herein by reference.

Figure 6:
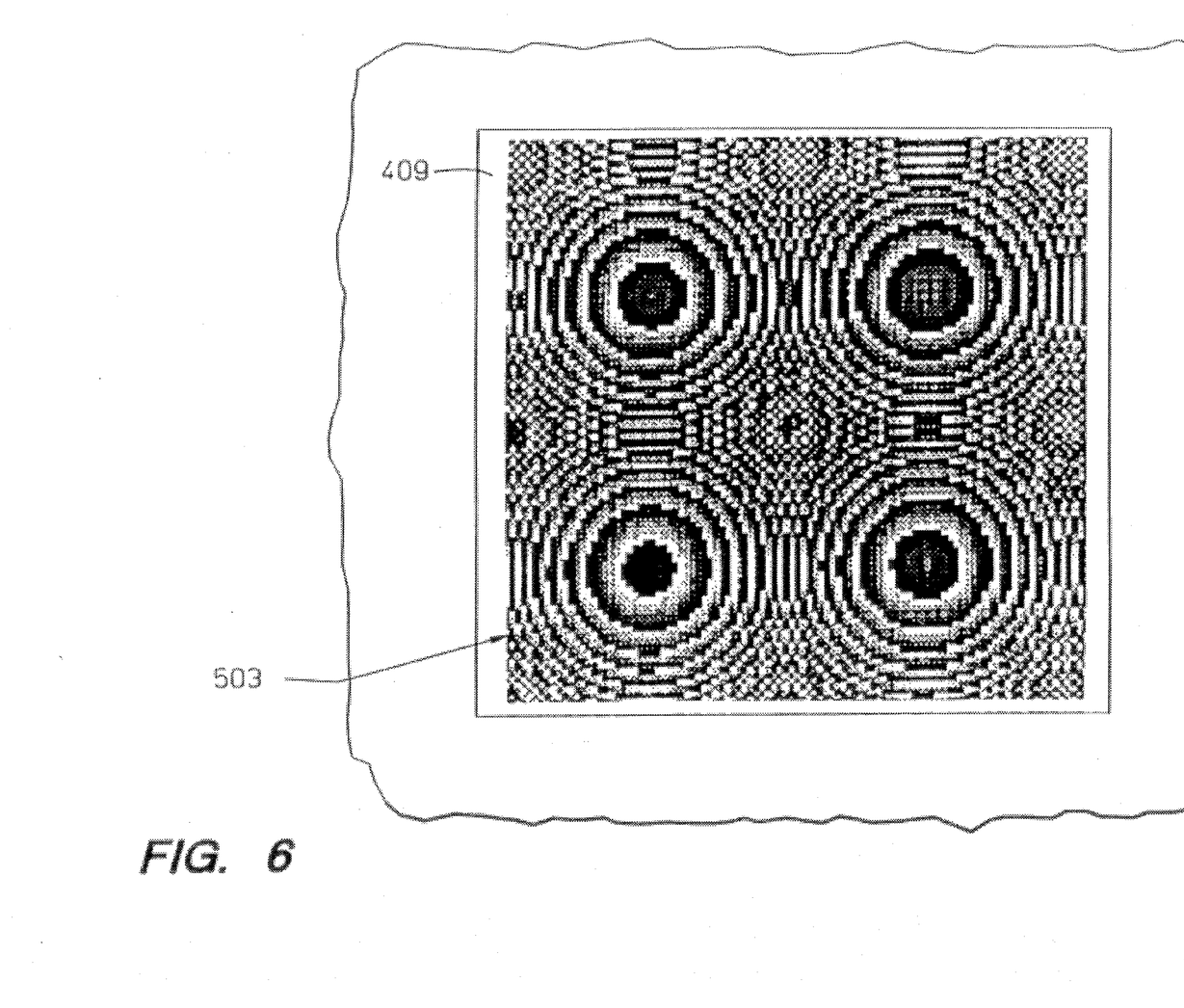
FIG. 6 shows a cut away detailed bottom view of the preferred embodiment, representatively showing an example hologram etched into a surface of one of the photonic devices

In general, FIG. 6 shows a cut away detailed bottom view of the preferred embodiment, representatively showing an example hologram etched into a surface of one of the photonic devices. More specifically, the example of FIG. 6 shows the hologram 601 etched into the receiving surface 409 of the second photonic device for redirecting the modulated beam of light into the second photonic device. As shown, the hologram 601 comprises an array of 100 by 100 pixels, each of which is approximately one by one micron in size. Each pixel is etched at a respective depth to produce a phase shift, relative to adjacent pixels, in an impinging wavefront of the modulated beam of light. The relative phase shift is an integral multiple of $2\pi/8$ selected to produce a desired wavefront, thereby steering the modulated beam of light. The required phase shift of each pixel is the difference between the phase of the impinging wavefront and the phase of the desired wavefront, which is computed using an equation:

Phase difference =

$$a\tan\left[\frac{\sin\left(\frac{2\pi}{\lambda}\sqrt{(x_i-x_o)^2+(y_i-y_o)^2+(z_i-z_o)^2}+\phi_i\right)}{\cos\left(\frac{2\pi}{\lambda}\sqrt{(x_i-x_0)^2+(y_i-y_0)^2+(z_i-z_0)^2}+\phi_i\right)}\right]$$

where $\lambda$ is a wavelength of the modulated beam of light, $x_i$ and $y_i$ are cartesian coordinates of the $i_{th}$ pixel in a plane of the receiving surface, $z_i$ is a cartesian coordinate of the $i_{th}$ pixel normal to the plane of the receiving surface, $x_o$, $y_o$, and $z_o$ are corresponding cartesian coordinates of a desired beam destination, and $\phi_i$ is the phase of the impinging wavefront at the $i_{th}$ pixel. The resulting phase shift is quantized to one of eight uniformly spaced phases over 0 to $2\pi$. The quantized phase is then assigned to the particular pixel. In the example shown in FIG. 6, the hologram 601 is designed to redirect a modulated light beam impinging upon the receiving surface 409 from a two o'clock direction at 80 degrees with respect to the surface.

The general principles discussed herein with respect to the hologram 601 etched into the receiving surface 409 are likewise applicable to the hologram etched into the emitting surface 407 of the first photonic device 406 for directing the path of the light beam emitted from the transmitter. It should be understood that while the hologram 601 representatively shown in FIG. 6 comprises an array of 100 by 100 pixels, each being approximately one by one micron in size and producing relative phase shift of integral multiple of $2\pi/8$, the holograms of the present invention are not strictly limited to a particular array size, pixel size, or relative phase shift size. Alternative holograms having suitable features consistent with the teachings of the invention can be used with beneficial results.

Figure 7:
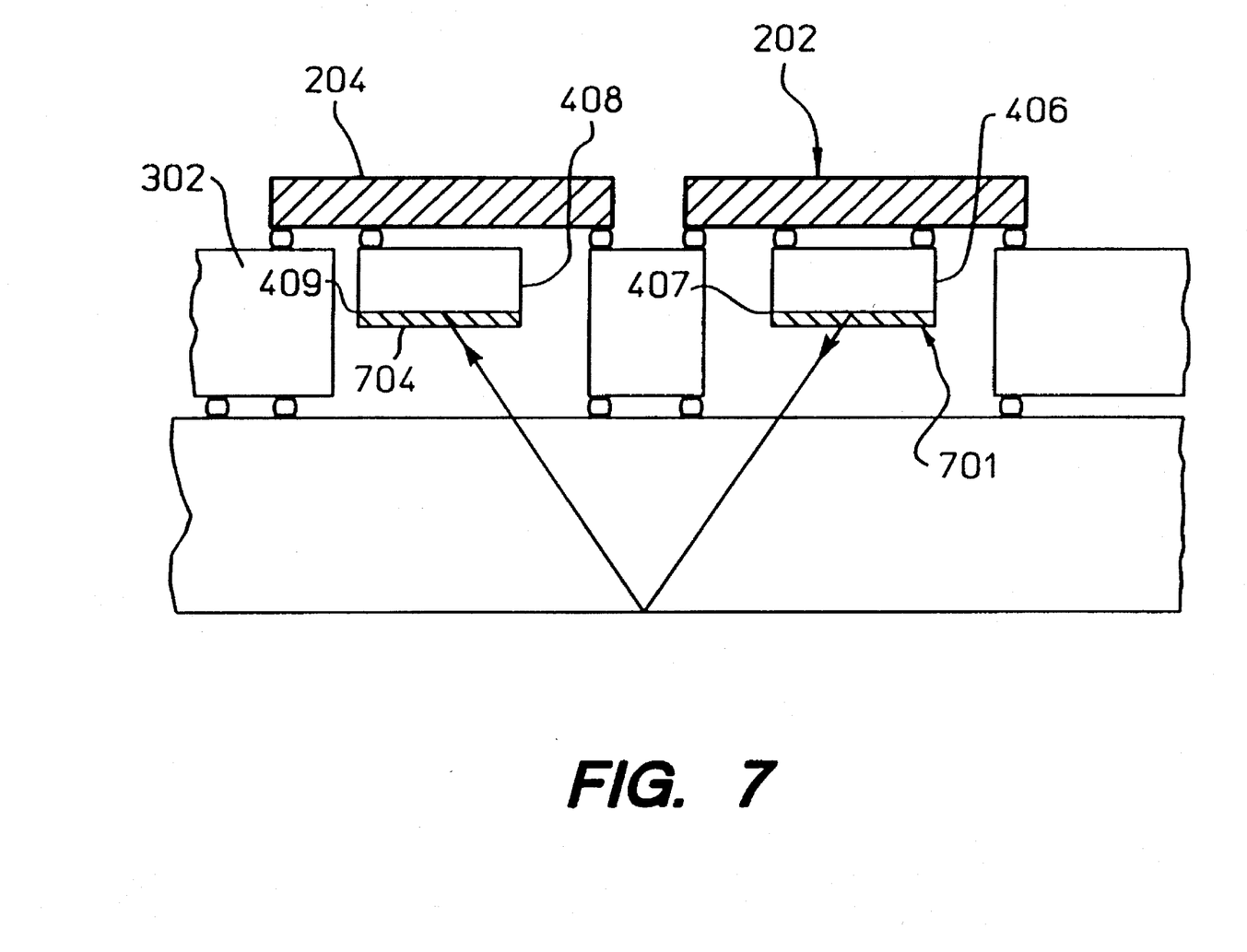
FIG. 7 is a cut away side view of an alternative embodiment showing a first and second holographic plate, each individually mounted on respective photonic devices.

FIG. 7 is a cut away side view of an alternative embodiment showing first and second holographic plates, each individually mounted on respective photonic devices. As shown in FIG. 7, the first photonic device 406 employed in the optoelectronic transmitter is optically coupled to the second photonic device 408, which is employed in the optoelectronic receiver. The alternative embodiment shown in FIG. 7 is substantially similar to the preferred embodiment discussed previously herein with respect to the cut away side view shown in FIG. 4. The alternative embodiment is distinguished from the preferred embodiment in that the alternative embodiment employs holographic plates 701, 704 having holograms incorporated therein, rather than holograms etched directly into surfaces of photonic devices as in the preferred embodiment. The holograms and holographic plates of the alternative embodiment can be fabricated by optical means in materials such as dichromated gelatin, photopolymers, or silver-halide emulsions, or by computer generated, binary, and multiphase step techniques.

Each holographic optical plate is mechanically coupled with a respective photonic device by Van der Waal bonding. As shown in FIG. 7, a first hologram is included in a first holographic plate 701 that is individually mounted to a surface 407 of the first photonic device using Van der Waal bonding, thereby preserving optical alignment between the first plate 701 and the first photonic device 406. Similarly, a second hologram is included in a second holographic plate 704 that is individually mounted to a surface 409 of the second photonic device using Van der Waal bonding, thereby preserving optical alignment between the second plate 704 and the second photonic device 408. Each holographic plate is individually aligned with the respective photonic device using a double sided mask aligner. Accordingly, the alternative embodiment is free from registration run off that is associated with previously known techniques employing large dimension optical substrates.

The alternative embodiment is further distinguished from the preferred embodiment because for the alternative embodiment the photonic device 407 of the transmitter is mounted on the first integrated circuit 202, as shown in FIG. 7 This is in contrast to the preferred embodiment discussed previously wherein the photonic device of the transmitter is mounted on the electrical interconnect substrate.

In the alternative embodiment, the first integrated circuit 202 is electrically connected to the first photonic device of the transmitter, as shown in FIG. 7. In turn, the first photonic device is optically coupled to the second photonic device 408, which is employed in the optoelectronic receiver. Holographic optical plates of the alternative embodiment are adapted to steer the modulated beam of light, directing the modulated beam of light along the optical path between the transmitter and the receiver.

Specifically, as shown in FIG. 7, the holographic plate individually aligned with the first photonic device 406 employed in the transmitter directs the path of the modulated beam of light emitted by the first photonic device. Features of the hologram of the first holographic plate are arranged for directing the path of the beam of light at an oblique angle with relative to the emitting surface, as shown in FIG. 7.

The holographic plate individually aligned with the second photonic device 408 employed in the receiver redirects the modulated beam of light into the second photonic device. The second holographic plate is oriented for receiving the modulated light beam at an oblique incidence to the plate. As shown in FIG. 7, the hologram of the second holographic plate includes features arranged to redirect the path of the obliquely incident light beam into the second photonic device. The second photonic device 408 of the receiver is electrically coupled to the second integrated circuit 204.

From the forgoing it will be appreciated that the embodiments of the present invention discussed herein provide for optically interconnecting integrated circuits while reducing optical alignment difficulties and enhancing signal quality. As discussed, the present invention employs a plurality of holograms, each hologram being individually aligned with a respective photonic device, thereby avoiding problems of registration run off that are associated with previously known techniques employing large dimension optical substrates.

Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

What is claimed is:

1. An optoelectronic apparatus comprising:
   a conductor for receiving an electrical drive signal from a first integrated circuit;
   an optoelectronic transmitter including a first photonic device for generating a beam of light coupled to the conductor, for modulating an emitted beam of light in response to the electrical drive signal and for emitting the beam of light in a direction along an optical path;
   an optoelectronic receiver, optically coupled to the transmitter, for receiving of light, the receiver including:
   a second photonic device for generating an electrical signal responsive to the modulated beam of light; and
   an etched holographic beam steerer, individually aligned and contiguous with the second photonic device, for redirecting the path of the light beam into the second photonic device; and
   another conductor, coupled to the optoelectronic receiver, for conducting the responsive electrical signal to a second integrated circuit.

2. An apparatus as in claim 1 wherein:
   the second photonic device has a receiving surface for receiving the modulated light beam; and
   the etched holographic beam steerer includes a hologram contiguous with the receiving surface of the second photonic device for redirecting the path of the light beam into the second photonic device.

3. An apparatus as in claim 2 wherein:
   the receiving surface is oriented for receiving the modulated light beam at an oblique incidence to the receiving surface; and
   the hologram contiguous with the receiving surface includes features etched into the receiving surface which redirects the obliquely incident light beam.

4. An apparatus as in claim 1 wherein:
   the second photonic device has a receiving surface for receiving the modulated light beam; and
   the etched holographic beam steer includes a holographic optical plate contiguous with the receiving surface of the second photonic device for redirecting the path of the light beam into the second photonic device.

5. An apparatus as in claim 1 wherein:
   the transmitter emits the modulated light beam along a plurality of paths, each path having a respective direction, and
   the apparatus further comprises:
   a plurality of optoelectronic receivers optically coupled to the transmitter for receiving the modulated light beam, each of the receivers including:
      a respective photonic device for generating a respective electric signal responsive to the modulated light beam; and
      a respective etched holographic beam steerer, individually aligned and contiguous with the respective photonic device, for redirecting a respective one of the paths of the light beam into the respective photonic device; and
   a plurality of conductors, each coupled to a respective one of the receivers, for conducting the respective one of the responsive electric signals to a respective receiving integrated circuit.

6. An apparatus as in claim 5 wherein:
   each of the photonic devices of the receivers has a respective surface for receiving the light beam; and
   each of the etched holographic beam steerers includes a respective hologram, contiguous with the respective receiving surface, for redirecting the respective one of the paths of the light beam into the respective photonic device.

7. An apparatus as in claim 5 wherein:
   each of the photonic devices of the receivers has a respective receiving surface for receiving the respective light beam; and each of the etched holographic beam steerers includes a respective holographic optical plate contiguous with the respective receiving surface.

8. An apparatus as in claim 1 wherein the optoelectronic transmitter includes another etched holographic beam steerer, individually aligned and contiguous with the first photonic device, for directing the path of the light beam emitted from the transmitter.

9. An apparatus as in claim 8 wherein:

the first photonic device has an emitting surface for emitting the light beam; and said another etched holographic beam steerer includes a hologram contiguous with the emitting surface of the first photonic device for directing the path of the light beam emitted from the emitting surface.

10. An apparatus as in claim 9 wherein: said hologram contiguous with the emitting surface includes features etched into the emitting surface which directs the path of the light beam at an oblique angle with respect to the emitting surface.

11. An optoelectronic apparatus comprising:

a conductor for receiving an electrical drive signal from a first integrated circuit;

an optoelectronic transmitter including a first photonic device for generating a beam of light, coupled to the conductor, for modulating said beam of light in response to the electrical drive signal, the transmitter including:

a first etched hologram, individually aligned and contiguous with the first photonic device, for directing the beam of light along an optical path;

an optoelectronic receiver, optically coupled to the transmitter, for receiving the modulated beam of light, the receiver including a second photonic device for generating an electrical signal in response to the modulated beam of light; and another conductor, coupled with the optoelectronic receiver, for conducting the responsive electrical signal to a second integrated circuit.

12. An apparatus as in claim 11 wherein said first etched hologram contiguous with the emitting surface includes features etched into the emitting surface which directs the beam of light on the optical path at an oblique angle with respect to the emitting surface.

13. An apparatus as in claim 11 wherein the receiver further includes a second etched hologram, individually aligned with the second photonic device, for redirecting the path of the light beam onto the second photonic device.

14. An apparatus as in claim 13 wherein:

the second photonic device has a receiving surface for receiving the modulated light beam; and the second etched hologram is contiguous with the receiving surface of the second photonic device.

15. An apparatus as in claim 14 wherein:

the receiving surface is oriented for receiving the modulated light beam at an oblique incidence to the receiving surface; and the second etched hologram includes features etched into the receiving surface and arranged to redirect the obliquely incident light beam.

16. An optoelectronic apparatus comprising:

a first photonic device for generating a beam of light;

a first etched hologram individually aligned and contiguous with the first photonic device for directing the beam of light along an optical path;

a second photonic device optically coupled to the first photonic device for receiving the beam of light; and a second etched hologram individually aligned and contiguous with the second photonic device for redirecting the beam of light into the second photonic device.

17. An apparatus as in claim 16 wherein:

the first photonic device has an emitting surface for emitting the beam of light; and the first etched hologram is contiguous with the emitting surface.

18. An apparatus as in claim 16 wherein:

the second photonic device has a receiving surface for receiving the beam of light; and the second etched hologram is contiguous with the receiving surface.

\* \* \* \* \*